United States Patent
Becker et al.

(10) Patent No.: US 11,575,063 B2
(45) Date of Patent: Feb. 7, 2023

(54) METHOD FOR FABRICATING A DETECTION DEVICE COMPRISING A STEP OF DIRECT BONDING OF A THIN SEALING LAYER PROVIDED WITH A GETTER MATERIAL

(71) Applicant: Commissariat à l'Energie Atomique et aux Energies Alternatives, Paris (FR)

(72) Inventors: Sébastien Becker, Grenoble (FR); Frank Fournel, Grenoble (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 17/105,822

(22) Filed: Nov. 27, 2020

(65) Prior Publication Data
US 2021/0184069 A1    Jun. 17, 2021

(30) Foreign Application Priority Data
Nov. 27, 2019   (FR) .................................... 19 13325

(51) Int. Cl.
*H01L 31/18* (2006.01)
*H01L 31/0203* (2014.01)
(Continued)

(52) U.S. Cl.
CPC ........ *H01L 31/186* (2013.01); *H01L 31/0203* (2013.01); *H01L 31/024* (2013.01); *H01L 31/0216* (2013.01); *H01L 31/09* (2013.01)

(58) Field of Classification Search
CPC .............. H01L 31/186; H01L 31/0203; H01L 31/0216; H01L 31/024; H01L 31/09;
(Continued)

(56) References Cited

U.S. PATENT DOCUMENTS

2017/0236800 A1* 8/2017 Gondcharton .......... H01L 24/27
                                                            438/458
2018/0321087 A1* 11/2018 Leduc ..................... G01J 5/045

FOREIGN PATENT DOCUMENTS

EP         3 399 290 A1    11/2018
WO   WO 2016/059094 A1    4/2016

OTHER PUBLICATIONS

French Preliminary Search Report dated Jul. 21, 2020 in French Application 19 13325 filed on Nov. 27, 2019 (with English Translation of Categories of Cited Documents & Written Opinion), 10 pages.

* cited by examiner

*Primary Examiner* — Hoang-Quan Ho
(74) *Attorney, Agent, or Firm* — Oblon, McClelland, Maier & Neustadt, L.L.P.

(57) ABSTRACT

The invention relates to a method for fabricating a thermal detector (1), comprising the following steps:
- forming a first stack (10), comprising a thermal detector (20), a mineral sacrificial layer (15) and a thin encapsulation layer (16) having a lateral vent (17.1);
- forming a second stack (30), comprising a thin sealing layer (33) and a getter portion (34);
- eliminating the mineral sacrificial layer (15);
- assembling by direct bonding the thin sealing layer (33), brought into contact with the thin encapsulation layer (16) and blocking the lateral vent (17.1), the getter portion (34) being located in the lateral vent (17.1).

13 Claims, 5 Drawing Sheets

(51) Int. Cl.
  *H01L 31/0216* (2014.01)
  *H01L 31/024* (2014.01)
  *H01L 31/09* (2006.01)
(58) Field of Classification Search
  CPC ... H01L 23/26; H01L 31/1876; H01L 31/115; H01L 27/14698; H01L 27/1462; G01J 2005/068; G01J 5/024; G01J 5/045; G01J 5/20
  See application file for complete search history.

METHOD FOR FABRICATING A DETECTION DEVICE COMPRISING A STEP OF DIRECT BONDING OF A THIN SEALING LAYER PROVIDED WITH A GETTER MATERIAL

TECHNICAL FIELD

The field of the invention is that of devices for detecting electromagnetic radiation, particularly infrared or terahertz radiation, comprising at least one thermal detector encapsulated in a sealed cavity in which a getter material is also located. The invention is applicable, notably, to the field of infrared imaging and thermography.

PRIOR ART

A device for detecting electromagnetic radiation, for example infrared or terahertz radiation, may comprise an array of thermal detectors, each comprising an absorbent portion for absorbing the electromagnetic radiation to be detected.

To provide thermal insulation for the thermal detectors, the absorbent portions usually take the form of membranes suspended above the substrate by anchoring pillars, and thermally insulated from the substrate by supporting and thermal insulation arms. These anchoring pillars and thermal insulation arms also have an electrical function, by electrically connecting the suspended membranes to a readout circuit that is usually positioned in the substrate.

The readout circuit usually takes the form of a CMOS circuit. It may be used for applying a control signal to the thermal detectors and for reading detection signals generated by the detectors in response to the absorption of the electromagnetic radiation to be detected. The readout circuit comprises different levels of electrical interconnection formed by metallic lines separated from one another by dielectric layers called inter-metal layers. At least one electrical connecting block of the readout circuit is positioned on the substrate in such a way that it can be contacted from the outside of the detection device.

The document EP3239670A1 describes a method for fabricating a detection device that uses mineral sacrificial layers for forming the thermal detectors, these layers being subsequently eliminated by wet chemical etching. A portion of a getter material, made of titanium for example, is located under each absorbent membrane, and is protected from the wet chemical etching by a carbonaceous sacrificial thin layer which is subsequently eliminated by special dry chemical etching. Thus the mineral sacrificial layers momentarily cover the carbonaceous sacrificial thin layer. This method therefore requires the protection of the getter material, in this case by the carbonaceous thin layer which may be degraded by the wet chemical etching used during the elimination of the mineral sacrificial layers. It is also important to safeguard the mechanical strength of the stack produced during the different steps of the fabrication method, particularly when the steps of planarizing the sacrificial thin layers are carried out.

The document EP3399290A1 describes another method for fabricating a detection device, in which the encapsulation structure defining the sealed cavity is formed by the application of a thin cap. More precisely, a first stack is formed, comprising the thermal detectors and the peripheral pillars, and having a peripheral sealing surface made of a metallic material, for example copper. A second stack is formed, comprising a thin layer forming the thin cap, provided with a getter portion and a peripheral sealing surface made of a metallic material, for example copper. This second stack is applied to the first, and the peripheral sealing surfaces are brought into contact and bonded to one another. The getter portion is covered with a protective layer to prevent its degradation during wet chemical etching that is used to eliminate the mineral sacrificial layers. In this method too, the getter material must be protected from the etching agent used in the elimination of the mineral sacrificial layers. Moreover, the use of copper for the bonding of the two stacks may complicate the fabrication method, since this material may not be available in some technological procedures.

DISCLOSURE OF THE INVENTION

The object of the invention is to overcome at least some of the drawbacks of the prior art, and notably to achieve freedom from the constraint of needing to protect the getter material during the wet chemical etching used to eliminate the mineral sacrificial layers. It is then possible to produce an encapsulation structure with a flat upper surface, which is advantageous when the addition of optical components (such as filters) is desired.

For this purpose, the invention proposes a method for fabricating a device for detecting electromagnetic radiation comprising the following steps:

forming a first stack, comprising a first substrate; at least one thermal detector resting on the first substrate, intended to detect the electromagnetic radiation, and covered with at least one mineral sacrificial layer made of a mineral material that can be eliminated by chemical etching; and a thin encapsulation layer, extending over the thermal detector and contributing to the delimiting of a cavity in which the thermal detector is located, comprising an upper part resting on the mineral sacrificial layer;

forming at least one vent, called a lateral vent, extending through the thin encapsulation layer, and being at a distance from the thermal detector in a plane parallel to the plane of the first substrate;

eliminating the sacrificial thin layer by chemical etching, this layer being discharged through the lateral vent.

According to the invention, the fabrication method comprises the following steps:

forming a second stack comprising: a supporting substrate; a thin layer called the sealing layer, which is transparent to the electromagnetic radiation; and at least one getter portion positioned on the thin sealing layer and partially covering the latter;

assembling the first and second stacks, after the elimination step, by bringing the thin sealing layer into contact with the upper part of the thin encapsulation layer and directly bonding it thereto, so that the getter portion is located in the lateral vent, which is then blocked by the thin sealing layer.

Some preferred but nonlimiting aspects of this method are the following.

The thin encapsulation layer may extend continuously above and around the thermal detector. Thus it may comprise the upper part and a peripheral part that extends across the mineral sacrificial layer and rests on the first substrate.

The step of assembly by direct bonding may be carried out at ambient temperature with a vacuum pressure less than or equal to $10^{-5}$ Pa.

The first stack may comprise an array of thermal detectors located in the cavity, comprising a step of forming a plurality of second release vents, the thin sealing layer additionally blocking the second release vents.

The thin encapsulation layer may be silicon-based, and the thin sealing layer may be silicon- or germanium-based.

The thin encapsulation layer may have a contact surface made of silicon, and the thin sealing layer may have a contact surface made of silicon or germanium. The step of assembly by direct bonding may comprise activation of said contact surfaces by partial ion beam etching and vacuum bonding.

The upper part of the thin encapsulation layer may be formed by a sub-layer made of silicon and a first metallic sub-layer, and the thin sealing layer may be formed by a sub-layer made of silicon or germanium and a second metallic sub-layer, the two metallic sub-layers being transparent to the electromagnetic radiation to be detected. The step of assembly by direct bonding may comprise bringing the two metallic sub-layers into contact with one another under a vacuum.

Said metallic sub-layers may each have a thickness less than or equal to 1 nm.

Said metallic sub-layers may be made of a material identical to that of the getter portion.

The first stack may comprise a plurality of arrays of thermal detectors, each array being located in a distinct cavity delimited at least partially by a thin encapsulation layer, the thin sealing layer coming into contact with the upper parts of the different thin encapsulation layers so as to block the different corresponding lateral vents.

The first stack may comprise a lateral reinforcing block formed by a lateral cavity delimited in the plane parallel to the substrate by peripheral parts of adjacent thin encapsulation layers, and delimited along the axis orthogonal to the first substrate by an intermediate upper part connecting the upper parts of the adjacent thin encapsulation layers, said lateral cavity being filled by the mineral sacrificial layer, thus reinforcing the mechanical strength of the thin encapsulation layers during the assembly of said stacks by direct bonding.

The lateral reinforcing block may be eliminated after the step of assembly by direct bonding, by etching the intermediate upper part and eliminating, by chemical etching, the mineral sacrificial layer located in the lateral cavity.

The getter portion may be located facing a thermal detector called a compensation detector, which is intended not to receive the electromagnetic radiation, the getter portion being opaque to the electromagnetic radiation.

The invention is also applicable to an electromagnetic radiation detection device comprising:
  a substrate;
  at least one thermal detector resting on the first substrate and intended to detect the electromagnetic radiation;
  a thin encapsulation layer, extending over the thermal detector and contributing to the delimiting of a cavity in which the thermal detector is located, comprising an upper part;
  at least one vent, called a lateral vent, extending through the thin encapsulation layer, and being at a distance from the thermal detector in a plane parallel to the plane of the first substrate;
  a thin sealing layer, transparent to the electromagnetic radiation, resting in contact with the upper part of the thin encapsulation layer, and blocking the lateral vent, the thin sealing layer having a flat upper surface opposed to the substrate;
  at least one getter portion assembled onto the thin sealing layer and partially covering the latter, and positioned in the lateral vent.

BRIEF DESCRIPTION OF THE DRAWINGS

Other aspects, aims, advantages and features of the invention will become more clearly apparent upon reading the following detailed description of preferred embodiments thereof, which description is given by way of non-limiting example and with reference to the appended drawings, in which.

DETAILED DISCLOSURE OF PARTICULAR EMBODIMENTS

In the figures and in the remainder of the description, the same references have been used to designate identical or similar elements. In addition, the various elements are not shown to scale for the sake of clarity of the figures. Moreover, the various embodiments and variants are not mutually exclusive and may be combined with one another. Unless indicated otherwise, the terms "substantially", "around", "of the order of" mean to within 10% and preferably to within 5%. Moreover, the terms "between . . . and . . . " and the like mean that the bounds are included, unless indicated otherwise.

The invention applies to a method for fabricating an electromagnetic radiation detection device capable of detecting infrared or terahertz radiation. This detection device comprises one or more thermal detectors, together with at least one material acting as a getter, located in a sealed cavity. The sealed cavity is delimited by an encapsulation structure which is formed by a plurality of thin layers that are transparent to the electromagnetic radiation to be detected, including, notably, a thin encapsulation layer extending continuously over the thermal detectors, and, if necessary, continuously over and around the latter. "Thin layer" is taken to mean a layer formed by the material deposition techniques used in microelectronics, with a thickness that is preferably less than or equal to 10 µm. A thin layer is said to be transparent when it has a transmission factor for a central wavelength of the electromagnetic radiation to be detected that is greater than or equal to 50%, preferably equal to 75%, or possibly equal to 90%.

According to the invention, this thin encapsulation layer comprises at least one lateral vent, which is at a distance, in a plane parallel to the substrate, from the thermal detector or detectors intended to receive the electromagnetic radiation. This lateral vent, together with any other release vents, is blocked by a thin sealing layer which has been assembled onto the thin encapsulation layer by direct bonding, of the SAB or ADB type in this case. The getter portion is then located inside the cavity and extends through the lateral vent. "Block" is taken to mean that the thin sealing layer covers the vent in such a way that it no longer provides access to the cavity from outside the latter. In this case, the thin sealing layer seals the cavity by preventing the transfer of gases into or from the cavity. In this case, the vent is not filled or blocked entirely by the thin sealing layer, since it is an applied layer instead of a layer deposited on the thin encapsulation layer, thus allowing the getter portion to be located in the vent, that is to say located in the space delimited in the plane XY by the boundary of the upper part of the thin encapsulation layer.

As a general rule, a material acting as a getter is a material intended to be exposed to the atmosphere of the sealed cavity and capable of carrying out gas pumping by absorption and/or adsorption. It is a metallic material, which may be chosen from among titanium, zirconium, vanadium, chromium, cobalt, iron, manganese, palladium, barium and/or aluminum, or an alloy of these metals such as TiZrV.

Direct bonding, of the SAB or ADB type in this case, is the fixing of two surfaces brought into contact with one another, without the addition of a special bonding material such as a resin or a polymer, but by the use of the attractive forces of atomic interaction between the surfaces to be bonded, with covalent or metallic bonds. It is a spontaneous bonding at ambient temperature. The ambient temperature may be a temperature of 40° C. or less, for example approximately 25° C. The direct bonding may be temperature- or pressure-assisted in order to increase the bonding energy and thus reinforce the adhesion of the surfaces and consequently the sealing of the cavity, for example if the surface state and the bonding machine are such that the expected performance cannot be directly achieved at ambient temperature with no pressure.

The fabrication method also comprises a step of producing the thermal detector or detectors by using at least one sacrificial layer known as a mineral layer, made of a mineral or inorganic material. In this case, the material is a silicon-based dielectric material which can also be used to form an inter-metal dielectric layer of the readout circuit, that is to say an electrically insulating material which, for example, has a dielectric constant, or relative permittivity, of less than or equal to 3.9, enabling the parasitic capacitance between the interconnections to be limited. This mineral material has no carbon chains, and may be a silicon oxide SiOx or a silicon nitride $Si_xN_y$, or an organosilicon material such as SiOC, SiOCH, or a material of the fluoride glass type such as SiOF. The mineral sacrificial layer may be eliminated by a wet chemical etching process, such as chemical etching in an acid medium, for example using hydrofluoric acid in the vapor phase (HF vapor). "Wet etching" is taken to mean, in a general manner, that the etching agent is present in the liquid or vapor phase, preferably in the vapor phase in this case.

FIGS. 1A to 1F show different steps of a method for fabricating a detection device 1 according to a first embodiment in which the direct bonding is of the SAB (Surface Activated Bonding) type. For the sake of clarity, only a part of the detection device 1 is shown in the figures. In this example, the method enables a plurality of detection devices 1, preferably identical to one another, to be fabricated simultaneously. The thin encapsulation layer also extends continuously over and around the thermal detectors. However, other configurations of the thin encapsulation layer are possible.

By way of example, in this case the thermal detectors 20 are capable of detecting infrared radiation in the LWIR (Long Wavelength Infrared) range, the wavelength of which is between approximately 8 µm and 14 µm. In this case, each detection device 1 comprises one or more thermal detectors 20, and in this case an array of identical thermal detectors 20, connected to a readout circuit located in the substrate 11 (which is then called the readout substrate), and located in the same sealed cavity 2. Thus the thermal detectors 20 form sensitive pixels arranged periodically, and may have a lateral dimension in the plane of the readout substrate 11 of the order of a few tens of microns, for example equal to approximately 10 µm or less.

At this point, and for the rest of the description, a three-dimensional direct reference system XYZ will be defined, where the plane XY is substantially parallel to the plane of the readout substrate 11, the axis Z being oriented in a direction substantially orthogonal to the plane of the readout substrate 11 leading toward the thermal detectors 20. The terms "vertical" and "vertically" are to be interpreted as relating to an orientation substantially parallel to the axis Z, and the terms "horizontal" and "horizontally" are to be interpreted as relating to an orientation substantially parallel to the plane (X,Y). Additionally, the terms "lower" and "upper" are to be interpreted as relating to a positioning that increases with distance from the readout substrate 11 in the direction +Z.

Figure 1A:
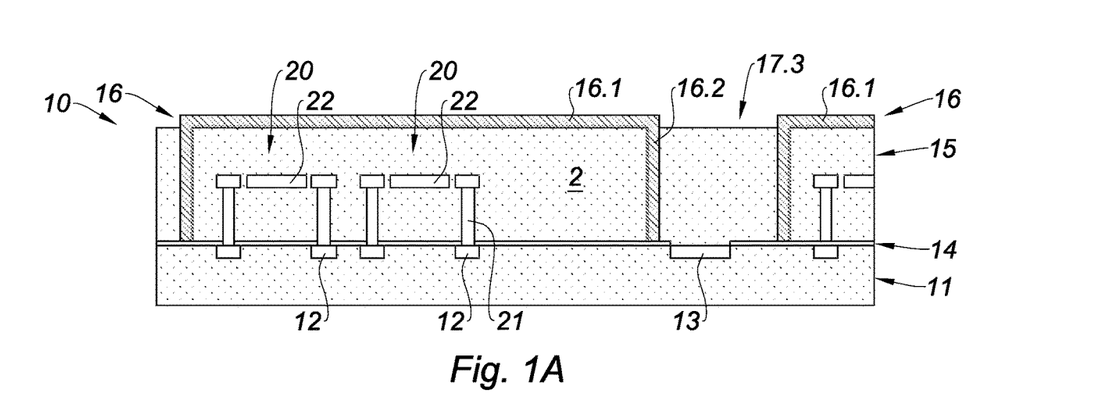
FIGS. 1A to 1F show different steps of a method for fabricating a detection device according to a first embodiment in which the direct bonding is of the SAB (for Surface Activated Bonding) type.

With reference to FIG. 1A, a first stack 10 is formed, comprising:
a first substrate 11, called the readout substrate;
at least one array of thermal detectors 20 resting on the readout substrate 11, intended to detect the electromagnetic radiation, and covered with at least one mineral sacrificial layer 15;
a thin encapsulation layer 16, extending continuously over the array of thermal detectors 20 along the axis Z and around the array in the plane XY.

In this example, a plurality of arrays of thermal detectors 20 rest on the readout substrate 11, and each is surrounded by a distinct thin encapsulation layer 16. Each thin encapsulation layer 16 is intended to delimit a cavity 2 which in this case houses an array of thermal detectors 20.

The readout substrate 11 is silicon-based, and is formed by a supporting substrate containing the readout circuit (not shown) capable of controlling and reading the thermal detectors 20. In this case, the readout circuit takes the form of a CMOS integrated circuit. It comprises, among other elements, portions of conducting lines separated from one another by inter-metal insulating layers made of a dielectric material, for example a silicon-based mineral material such as silicon oxide $SiO_x$, silicon nitride $SiN_x$, among others. Conducting portions 12 are flush with the surface of the supporting substrate, and provide the electrical connection of the anchoring pillars 21 of the thermal detectors 20 to the readout circuit. Additionally, in this case one or more connecting portions 13 are flush with the surface of the supporting substrate, and enable the readout circuit to be connected to an external electronic device.

The readout substrate 11 may comprise a reflector (not shown) positioned facing each thermal detector 20. The reflector may be formed by a portion of a conducting line of the last level of interconnection, this line being made of a material capable of reflecting the electromagnetic radiation to be detected. It extends facing the absorbent membrane 22 of the thermal detector 20, and is intended to form with the latter a quarter-wave interference cavity for the electromagnetic radiation to be detected.

Finally, the readout substrate 11 in this case comprises a protective layer 14 such that the upper inter-metal insulating layer, notably, is covered. This protective layer 14 corresponds in this case to an etching stop layer made of a material that is substantially inert to the chemical etching agent used subsequently to eliminate the different mineral sacrificial layers 15, in the HF medium in the vapor phase for example. This protective layer 14 thus forms a sealed, chemically inert layer which is electrically insulating to prevent any short circuit between the anchoring pillars 21. Thus it can prevent the underlying inter-metal insulating layers from being etched during this step of eliminating the mineral sacrificial layers 15. It may be formed of an aluminum oxide or nitride, or of aluminum trifluoride, or of amorphous silicon which is not intentionally doped. The protective layer 14 does not cover the connecting portions 13, thereby enabling them to be electrically connected to an external electrical device.

The thermal detectors 20 are then formed on the readout substrate 11. These production steps are identical or similar to those described, notably, in the document EP3239670A1. The thermal detectors 20 in this case are microbolometers, each comprising an absorbent membrane 22, that is to say a membrane capable of absorbing the electromagnetic radiation to be detected, suspended above the readout substrate 11 by anchoring pillars 21, and thermally insulated from the substrate by supporting and thermal insulation arms. Absorbent membranes 22 are conventionally produced by surface micro-machining techniques consisting in the formation of the anchoring pillars 21 through a first mineral sacrificial layer, and the formation of the thermal insulation arms and the absorbent membranes 22 on the upper surface of the sacrificial layer. Each absorbent membrane further comprises a thermometric transducer, for example a thermistor material connected to the readout circuit by electrical connections provided in the thermal insulation arms and in the anchoring pillars 21.

A second mineral sacrificial layer, preferably of the same kind as the first mineral sacrificial layer, is then deposited. The second mineral sacrificial layer covers the mineral sacrificial layer and the thermal detectors 20. In the drawings, the two mineral sacrificial layers 15 are shown together.

The thin encapsulation layer 16 of an encapsulation structure is then formed in a similar way to that described in the document EP3239670A1, for each array of thermal detectors 20. Firstly, conventional photolithography techniques are used to etch the mineral sacrificial layers 15 locally to form trenches opening onto the readout substrate 11. The conforming deposition of the thin encapsulation layer 16, of amorphous silicon in this case, is then carried out, this layer extending over the mineral sacrificial layer 15 and into the trenches, by chemical vapor deposition (CVD, for Chemical Vapor Deposition) for example. Evidently, the encapsulation layer 16 may comprise supporting pillars as described, notably, in the document EP3067674A2.

The thin encapsulation layer 16 therefore comprises an upper part 16.1 (also called the upper wall) which extends above, and at a distance along the axis Z from, the thermal detectors 20, and a peripheral part 16.2 (also called the peripheral wall) which continuously surrounds the thermal detectors 20 in the plane XY. The upper wall 16.1 therefore rests on, and in contact with, the mineral sacrificial layer 15. The thin encapsulation layer 16 is intended to delimit the cavity 2 along the direction +Z and in the plane XY. The upper part 16.1 and the peripheral part 16.2 are therefore formed in one piece and from the same material(s).

In this example, different thin encapsulation layers 16, distinct from one another, are formed, each belonging to a different detection device 1. For this purpose, the same thin encapsulation layer 16 may be deposited in such a way that it continuously covers the different arrays of thermal detectors 20 and extends into the different trenches. It is then locally etched to form a peripheral opening 17.3, enabling the different thin encapsulation layers 16 to be made distinct from one another. The upper walls 16.1 of the different thin encapsulation layers 16 are also distinct from one another. In this example, the encapsulation material does not extend beyond the connecting portion or portions 13.

Figure 1B:
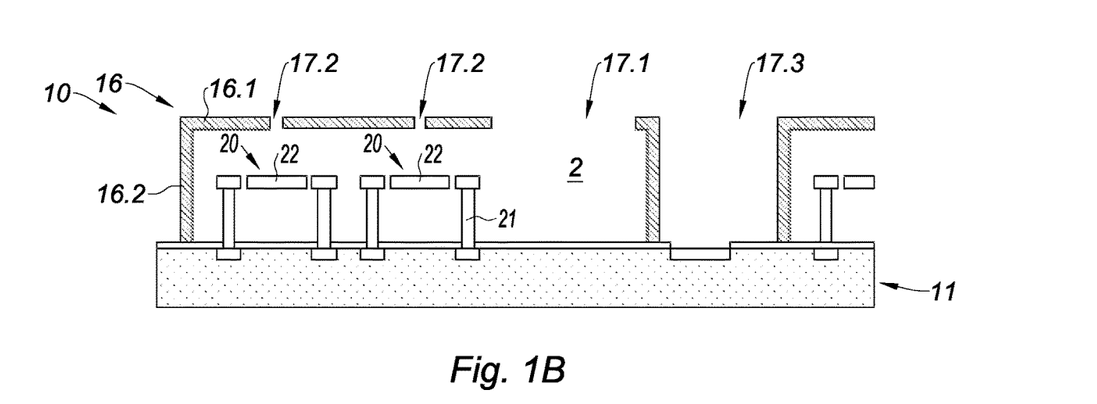

With reference to FIG. 1B, at least a first release vent 17.1, called a lateral vent, and advantageously, in this case, second release vents 17.2 are formed by photolithography and etching in the thin encapsulation layer 16. These vents 17.1, 17.2 are notably intended to allow the discharge of the different mineral sacrificial layers 15 from the cavity 2, and are penetrating openings formed through the thin encapsulation layer 16 and opening onto the underlying mineral sacrificial layer 15. The peripheral openings 17.3 may be formed in this step.

The lateral vent 17.1 is intended to allow the introduction into the cavity 2 of at least one getter portion 34, which is fixed to a thin sealing layer 33 that is applied and assembled by direct bonding onto the thin encapsulation layer 16. It may have dimensions larger than those of the second release vents 17.2, so as to allow the introduction of the getter portion 34. It is also called lateral because it is at a distance from the thermal detectors 20 in a plane XY parallel to the plane of the substrate; that is to say, it is spaced at a non-zero distance from at least the absorbent membranes 22, and preferably also from the thermal insulation arms and the anchoring pillars 21. It is also at a distance from the optically active thermal detectors 20, that is to say those intended to detect the infrared radiation, so that the presence of the getter portion 34 does not interfere with the transmission of the electromagnetic radiation to be detected. In a variant, as described below, it may overhang a compensation thermal detector, that is to say a thermal detector that is called blind, since it is intended not to receive or detect the electromagnetic radiation.

The second release vents 17.2 may be positioned between two adjacent thermal detectors 20, or may be positioned facing the absorbent membranes 22 along the axis Z, as described in the application EP3067675A1. By contrast with this document, since the thin sealing layer 33 is applied to the thin encapsulation layer 16, there is no risk that any sealing material will fall through the second vents onto the absorbent membranes 22. The absorbent membranes 22 may then have no penetrating opening located perpendicularly to a corresponding second vent as described in this application EP3067675A1, thus enabling the performance of the detection device to be improved.

Chemical etching capable of eliminating the mineral sacrificial layers 15 is then carried out, in this case wet chemical etching by the action of hydrofluoric acid in the vapor phase. The products of the chemical reaction are discharged through the lateral vent 17.1 and the second release vents 17.2. Since this wet chemical etching is isotropic, it results in the suspension of the absorbent membranes 22 and the thermal insulation arms, and the anchoring pillars 21 are released. The parts of the mineral sacrificial layers 15 located between the adjacent thin encapsulation layers 16, notably those covering the connecting portion or portions 13, are also eliminated during this chemical etching, via the peripheral opening 17.3 in this case.

Figure 1C:
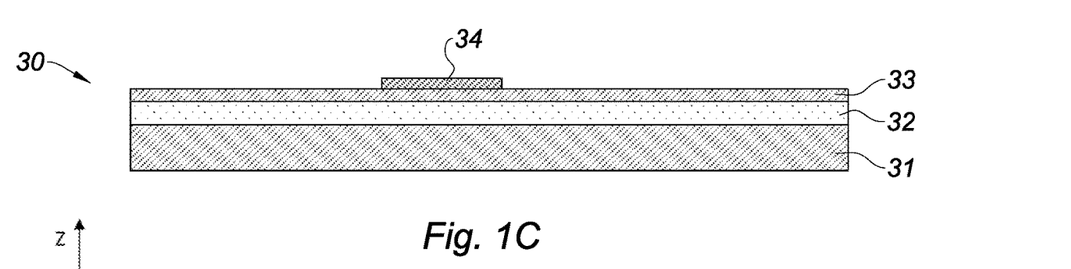

With reference to FIG. 1C, a second stack 30 is formed, comprising:
 a supporting substrate;
 a thin layer called the sealing layer 33, resting on the supporting substrate and transparent to the electromagnetic radiation to be detected; and
 at least one getter portion 34 positioned on the thin sealing layer 33 and partially covering the latter.

The second stack 30 may be formed from an SOI substrate or a GeOI substrate. The supporting substrate is then formed from a silicon substrate 31 having a thickness of several hundred microns for example, and from a buried oxide (BOX) layer 32. The thin sealing layer 33 may be made of silicon in the case of an SOI substrate, or of germanium in the case of a GeOI substrate. The material and the thickness of the thin sealing layer 33 are chosen so that it is transparent to the electromagnetic radiation to be detected. Thus it may have a thickness less than or equal to 200 µm or possibly 10 µm, or preferably less than or equal to 5 µm, for example equal to about 100 nm.

The getter portion 34 has dimensions and an arrangement on the thin sealing layer 33 such that it can be introduced through the lateral vent 17.1. Thus, by way of illustration, it may have a thickness of about 100 nm to 1 µm, typically 300 nm, and lateral dimensions depending on the arrangement of the getter portion relative to the detector or detectors. These dimensions may thus be of the order of several mm² so that, for example, this portion extends vertically over a plurality of compensation detectors, or may have much smaller dimensions, notably when a grid of getter portions is provided. This step of forming the second stack 30 may evidently be carried out before, during or after the steps described previously.

In this example, the thin encapsulation layer 16 is formed of a single material, amorphous silicon in this case, so that the upper wall 16.1 and the peripheral wall are entirely made of amorphous silicon. The thin sealing layer 33 is also formed from a single material, in this case silicon (for an SOI substrate) or germanium (for a GeOI substrate). In a variant, as described below, the thin encapsulation layer 16 and the thin sealing layer 33 may be, at least locally, multilayers, the surface to be brought into contact then being formed by metallic sub-layers.

Figure 1D:
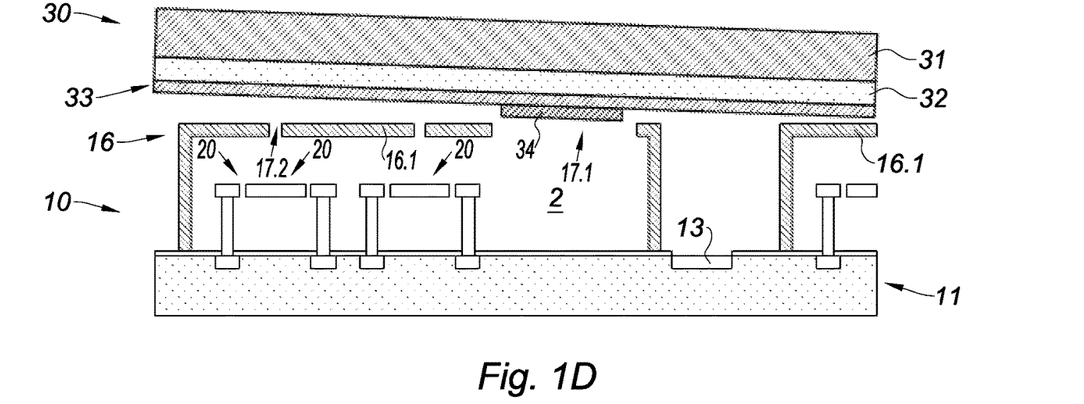

With reference to FIG. 1D, the second stack 30 is assembled onto the first stack 10 by bringing the thin sealing layer 33 into contact with the thin encapsulation layer 16 and directly bonding it thereto. In this example, the same thin sealing layer 33 of the second stack 30 is brought into contact with the upper parts 16.1 of the different thin encapsulation layers 16.

The surfaces brought into mutual contact and assembled by direct bonding are substantially flat. Thus a preliminary step of planarizing the thin encapsulation layer 16 may be carried out before the forming of the vents 17.1, 17.2 and the peripheral opening 17.3. A step of planarizing the thin sealing layer 33 may also be carried out before the forming of the getter portion 34.

Since the thin sealing layer 33 is a continuous flat layer, it is capable of blocking the lateral vents 17.1 as well as the second release vents 17.2, thus sealing the cavity 2 and, in this case, the cavities 2 of the different arrays of thermal detectors 20. Each lateral vent 17.1 receives at least one getter portion 34, which is therefore introduced into the corresponding cavity 2. The surface of the thin sealing layer 33 oriented toward the substrate 11 is a flat surface. The thin sealing layer 33 covers the lateral vent 17.1 and thus blocks it without any of the sealing material extending into the lateral vent 17.1. The surface of the thin sealing layer 33 opposite the substrate 11 is also flat.

The direct bonding is preferably what is known as SAB (Surface Activated Bonding). This bonding technique is notably suitable for the direct bonding of two silicon layers at ambient temperature, without any intermediate bonding material such as resin or polymer. This bonding technique is, notably, described in the paper by Takagi et at, entitled *Surface activated bonding of silicon wafers at room temperature*, Appl. Phys. Lett. 68, 2222 (1996). It may also be used for the direct bonding of a thin sealing layer 33 of germanium onto the thin encapsulation layer 16 of silicon.

For this purpose, the free silicon surfaces (contact surfaces) of the upper walls 16.1 and of the thin sealing layer 33 have been activated in advance by partial ion beam etching, for example by using a beam of atoms of argon, or of He, Ne, Xe or Kr. If this surface preparation has resulted in a slight etching of the surface of the getter portion 34, a thin protective layer, with a thickness of about 10 nm for example, may be deposited in advance so as to cover and therefore protect the getter portion 34. This thin protective layer is then etched progressively during this surface preparation until it is completely etched at the end of this preparation, thus freeing the surface of the getter portion 34.

The free silicon surface of the thin sealing layer 33 is therefore brought directly into contact with the upper silicon surface of the upper wall 16.1 of the thin encapsulation layer 16. The silicon contact surfaces are brought into contact under a vacuum, preferably with a vacuum pressure less than or equal to $10^{-7}$ mbar (i.e. $10^{-5}$ Pa). A pressure force, of between 0.05 and 1.6 MPa for example, may be exerted on the application substrate in the direction of the sensor stack.

This results in direct bonding between the surfaces in contact, by covalent silicon-silicon or silicon-germanium bonding. The bonding energy is high because of the attachment by covalent bonds, and the sealing of the cavity 2 is therefore reinforced. An adhesion of at least 2 J/m² may be obtained at ambient temperature. In this case, no post-bonding annealing is required. This avoids the risk of degradation of the readout circuit that would arise from annealing at a temperature above the thermal budget of a CMOS readout circuit contained in the substrate 11, which is approximately 350° C. to 400° C. Additionally, the bonding interface is formed here by the silicon-silicon (or silicon-germanium) surfaces, and contains no oxide that could reduce the transmission of the light radiation toward the thermal detectors 20. Thus the performance of the detection device 1 is maintained.

A temperature difference may be applied to the two stacks 10, 30 in order to generate a small mechanical tensile stress within the second stack 30, thus improving its flatness and reducing the residual mechanical stress after assembly. This temperature difference may be greater than 0° C. and less than or equal to 150° C., for example equal to about 50° C., so as to generate a tensile stress of about 25 MPa within the second stack 30.

Figure 1E:
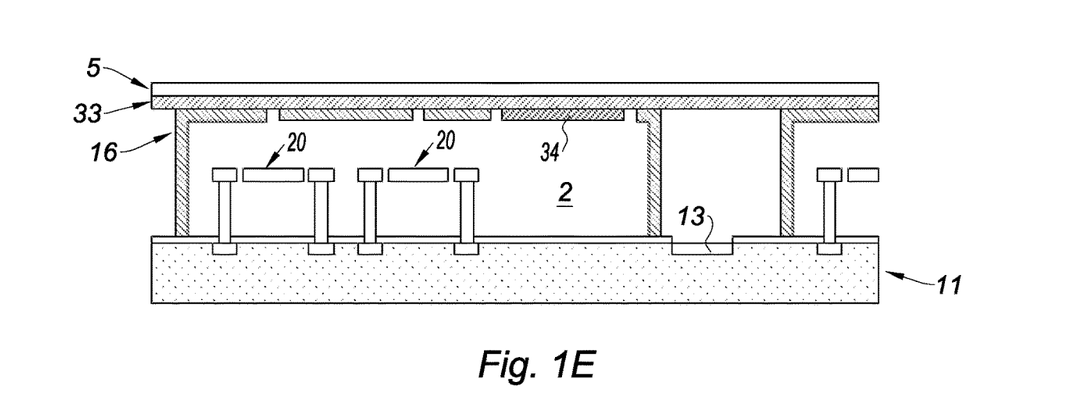

With reference to FIG. 1E, it is advantageous to eliminate the supporting substrate of the second stack 30, which in this case is the silicon substrate 31 and the buried oxide layer 32, in order to free the surface of the thin sealing layer 33 opposite the substrate. For this purpose, it is possible to carry out grinding on part of the silicon substrate 31 so as to obtain a residual layer with a thickness of several microns, followed by chemical etching of the residual layer with the etching stopping on the oxide layer 32. There are other possible techniques. The oxide layer 32 is then eliminated, by chemical etching with hydrofluoric acid in the vapor phase for example. Thus one face of the thin sealing layer 33 is left free.

An antireflection layer 5 can then be deposited on the thin sealing layer 33, to optimize the transmission of the electromagnetic radiation through the encapsulation structure. This antireflection layer 5 may be made of zinc sulfide with a thickness of about 1.2 µm, or of amorphous carbon. Other types of antireflection layers may be used, such as a microstructured layer of the Moth Eye type.

Figure 1F:
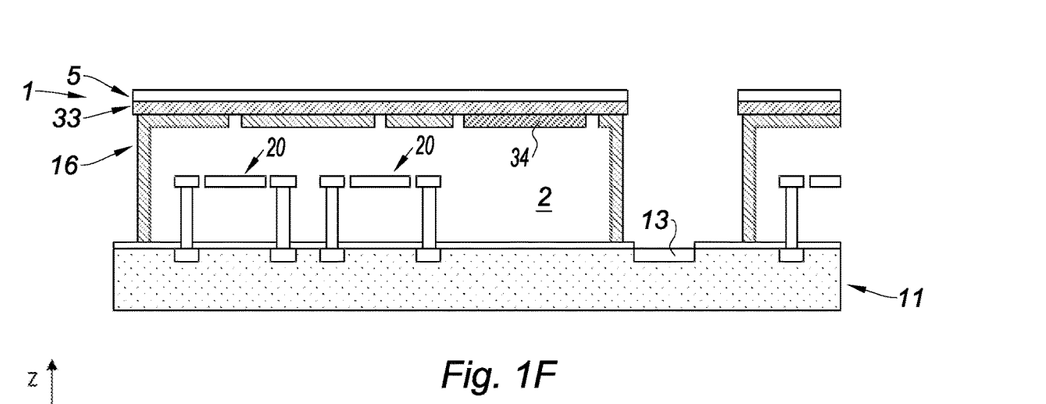

With reference to FIG. 1F, the antireflection layer 5 and the thin sealing layer 33, which extend above the connecting portions 13 and connect the different thin encapsulation layers 16, are then locally etched so as to give access to the connecting portions 13 and make it possible to provide an electrical connection, of the wire type (wire bonding) for example, between the connecting portions 13 and an external electrical device.

It is also possible to carry out a step of cutting out the stack to dissociate the different arrays of thermal detectors 20 from one another. This cutting-out step may be carried out by following cutting lines predefined by known techniques such as mechanical and/or laser cutting, chemical etching, physical etching, or others.

Thus the fabrication method may be used to produce a detection device 1 comprising an encapsulation structure delimiting a sealed cavity 2 in which, in this case, a plurality of thermal detectors 20 are located, together with at least one getter portion 34. The encapsulation structure is formed by a thin encapsulation layer 16 that extends continuously above and around the thermal detectors 20, and by a thin sealing layer 33 assembled by direct bonding onto the thin encapsulation layer 16. A getter portion 34 is fixed to the thin sealing layer 33 and is introduced into the cavity 2 during the application, through the lateral vent 17.1 of the thin encapsulation layer 16, which is at a distance from the optically active thermal detectors 20.

Since the mineral sacrificial layers 15 are eliminated before the application of the thin sealing layer 33 provided with the getter portion 34, the getter portion 34 is protected from any degradation that it might suffer as a result of the wet chemical etching, for example HF vapor etching, used for eliminating the mineral sacrificial layers 15.

Additionally, because the getter portion 34 is introduced into the cavity 2 by means of the thin sealing layer 33, the mechanical support of the mineral sacrificial layers 15 is preserved during the steps of planarizing the different mineral sacrificial layers 15 deposited. This avoids the mechanical fragility mentioned in the document EP3239670A1, which is apparent during the planarization of the mineral sacrificial layers 15 when they rest on a carbonaceous sacrificial thin layer such as polyimide, where the getter portion 34 is located under a thermal detector and is protected from the HP vapor etching by the polyimide carbonaceous layer. This is because, in the context of the invention, the mineral sacrificial layers 15 do not rest on a carbonaceous sacrificial layer that would protect a getter portion 34 resting on the substrate, so that this mechanical fragility is avoided in this case.

Moreover, the getter portion 34 is not located facing the absorbent membranes 22, as is the case in the document EP3239670A1, making it possible to use a larger surface area of getter material. Furthermore, the getter material may be chosen solely on the basis of its chemisorption properties, and not on the basis of a supplementary property of optical reflection. A getter material having a high chemisorption performance may therefore be chosen.

The assembly of the second stack 30 onto the first stack 10 does not require the use of copper for the direct bonding, thus simplifying the fabrication method. Additionally, the assembly by SAB bonding may be carried out at ambient temperature while obtaining high-quality sealing of the cavity 2. Thus it is possible to avoid degrading the readout circuit in the first substrate, or causing an undesired change in the properties of the thermometric material used in the absorbent membranes. The getter can also be activated before or after the assembly step.

FIGS. 2A to 2E show different steps of a fabrication method according to a variant of the first embodiment. This method differs from that described above essentially in that it comprises a temporary lateral block 4 located between the cavities 2 housing the arrays of thermal detectors 20. This lateral block 4 provides mechanical reinforcement during the step of assembly by direct bonding, particularly when the direct bonding is pressure-assisted. Furthermore, the lateral block 4 in question is called "temporary" because it is subsequently eliminated, in this case in order to allow access to the connecting portions 13 and to enable the resulting final stack to be cut out.

Figure 2A:
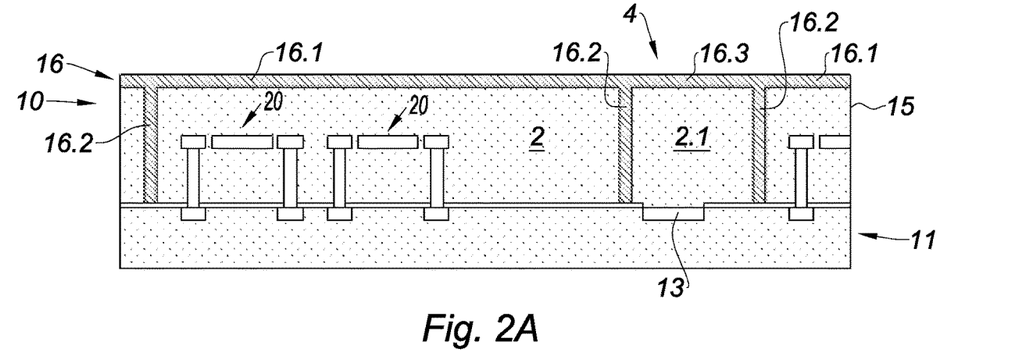
FIGS. 2A to 2E show different steps of a method for fabricating a detection device according to a variant of the first embodiment in which a temporary lateral reinforcing block is present during the application of the second stack.

With reference to FIG. 2A, a first stack 10, similar to that described previously and shown in FIG. 1A, is formed. However, it is distinguished therefrom essentially in that the same thin encapsulation layer 16 extends continuously above the different detection arrays. Additionally, the upper walls 16.1 extending above the adjacent arrays of thermal detectors 20 are interconnected by an intermediate upper wall 16.3, which in the case overhangs the connecting portions 13. Additionally, a lateral reinforcing block 4 is formed by the intermediate upper wall 16.3 and by the peripheral walls 16.2 that delimit adjacent cavities 2. These walls delimit what is called a lateral cavity 2.1, which is entirely filled by the mineral sacrificial layers 15. In this case, the connecting portion or portions 13 are positioned in the lateral reinforcing block 4. The latter is therefore positioned between two adjacent arrays of thermal detectors 20. It may extend so as to surround, at least partially, the same array of thermal detectors 20.

Figure 2B:
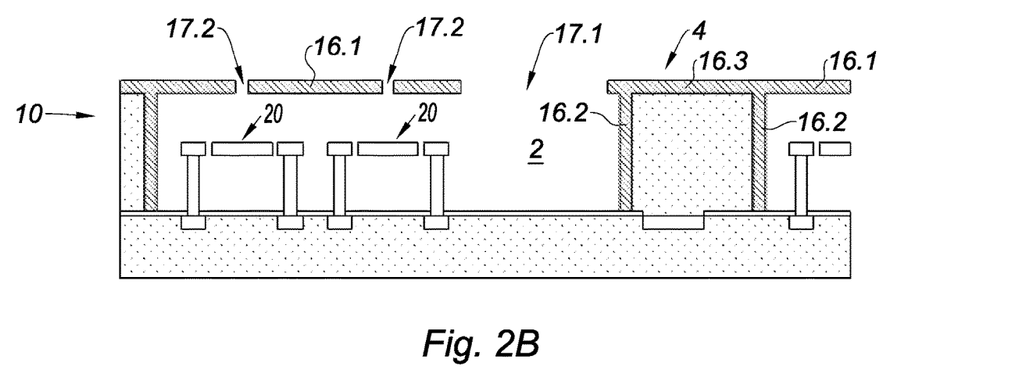

With reference to FIG. 2B, the lateral vent or vents 17.1 and the second release vents 17.2 are formed in the upper walls 16.1 extending above the arrays of thermal detectors 20. In this case, however, the peripheral opening 17.3 is not formed at this stage, so the lateral reinforcing block 4 remains intact. Wet chemical etching, for example HF vapor etching, is then carried out to eliminate the parts of the mineral sacrificial layer 15 located under the upper walls 16.1 in the cavities 2. However, the part of the mineral sacrificial layer 15 located in the lateral reinforcing block 4 is not eliminated, since it is protected from the chemical etching by the peripheral walls 16.2 and by the intermediate upper wall 16.3.

Figure 2C:
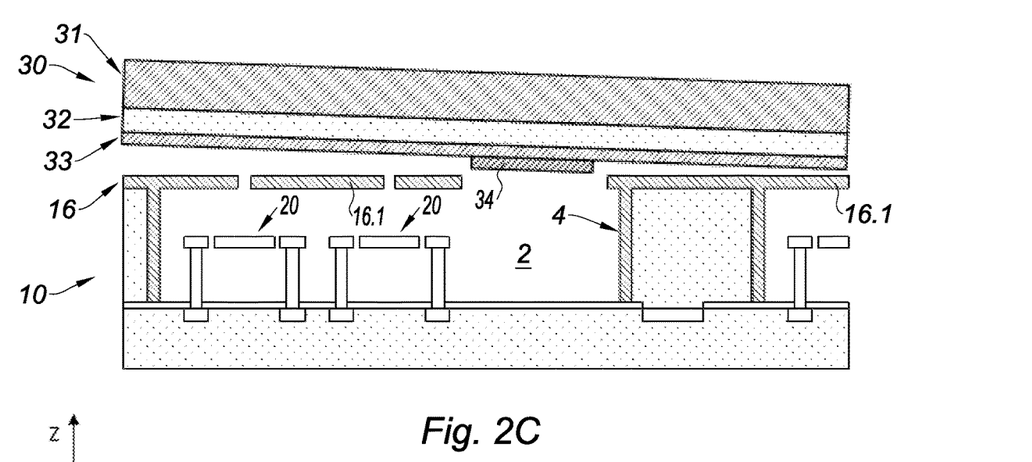

With reference to FIG. 2C, after the second stack 30 has been formed as described previously (FIG. 1C), the second stack 30 is assembled onto the first stack 10 by bringing the thin sealing layer 33 into contact with the thin encapsulation layer 16 and directly bonding it thereto. The thin sealing layer 33 therefore comes into contact with the upper walls 16.1 located above the arrays of thermal detectors 20, together with the intermediate upper wall 16.3. The lateral reinforcing block 4 enables the mechanical strength of the thin encapsulation layer 16 to be improved during the direct bonding, this being particularly advantageous when the direct bonding is pressure-assisted as described previously.

Figure 2D:
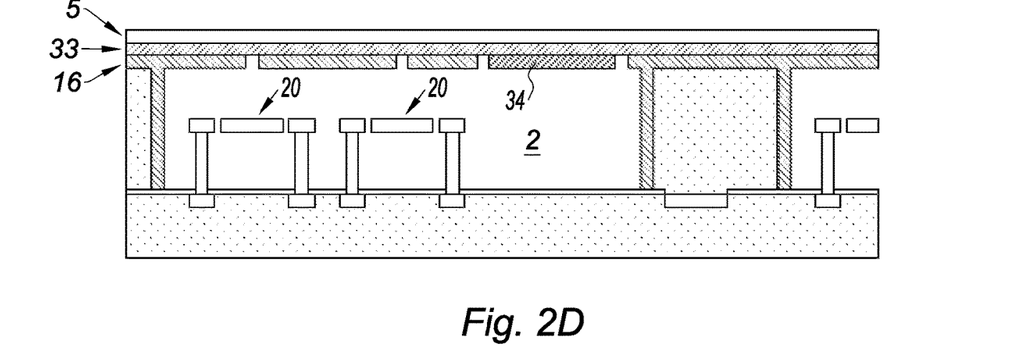

With reference to FIG. 2D, the supporting substrate of the second stack 30, in this case the silicon substrate 31 and the buried oxide layer 32, is eliminated, in order to free a surface of the thin sealing layer 33. Thus the antireflection layer 5 is deposited on the surface of the thin sealing layer 33 that is left free. These steps are identical in this case to those described with reference to FIG. 1E.

Figure 2E:
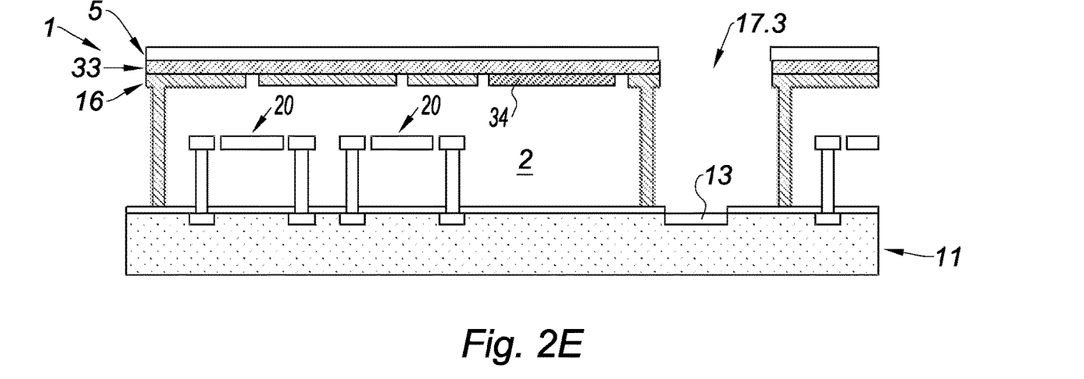

With reference to FIG. 2E, the peripheral opening or openings 17.3 are formed through the stack formed by the antireflection layer 5, the thin sealing layer 33, and the thin encapsulation layer 16. The intermediate upper wall 16.3 is therefore at least partly eliminated, thus allowing access to the mineral sacrificial layers 15. The mineral sacrificial layers 15 forming the lateral block 4 are then eliminated, by chemical etching with HF vapor for example. Thus the connecting portion or portions 13 are left freely accessible. The resulting stack may then be cut to dissociate the different arrays of thermal detectors 20 from one another.

The fabrication method according to this variant thus enables the temporary presence of a lateral reinforcing block in the first stack 10 to be profitably used to reinforce the mechanical strength of the thin encapsulation layer 16 during the assembly of the second stack 30 onto the first stack 10 by direct bonding.

Figure 3:
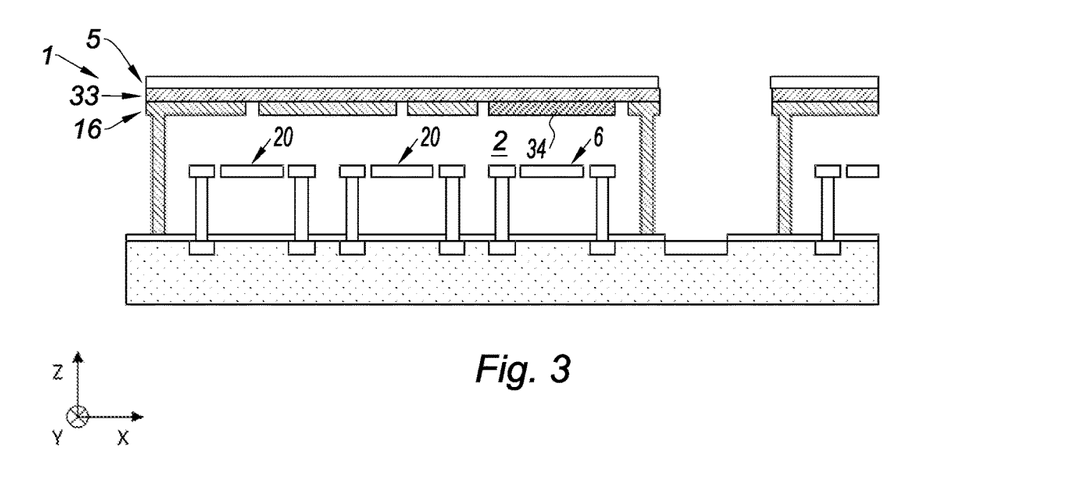
FIG. 3 is a schematic and partial sectional view of a detection device produced according to another variant of the first embodiment of the invention, in which the getter portion is positioned facing a compensation thermal detector.

FIG. 3 is a schematic and partial sectional view of a detection device 1 produced by a fabrication method according to another variant of the first embodiment.

In this case, the detection device 1 differs from those described previously essentially in that it comprises at least one compensation thermal detector 6, positioned in a sealed cavity 2, with the getter portion 34 facing it. Thus the getter portion 34 is positioned at a distance from the thermal detectors 20 intended to detect the infrared radiation, so as not to interfere with the transmission of the electromagnetic radiation toward these thermal detectors 20. However, it is positioned facing the compensation thermal detector 6, and notably facing the whole of its suspended membrane, so as to block the transmission of the electromagnetic radiation toward this thermal detector 6. The getter portion 34 is therefore made of a material and with a thickness such that it does not transmit the electromagnetic radiation to be detected. In other words, the getter portion 34 is opaque to the electromagnetic radiation to be detected.

Figure 4A:
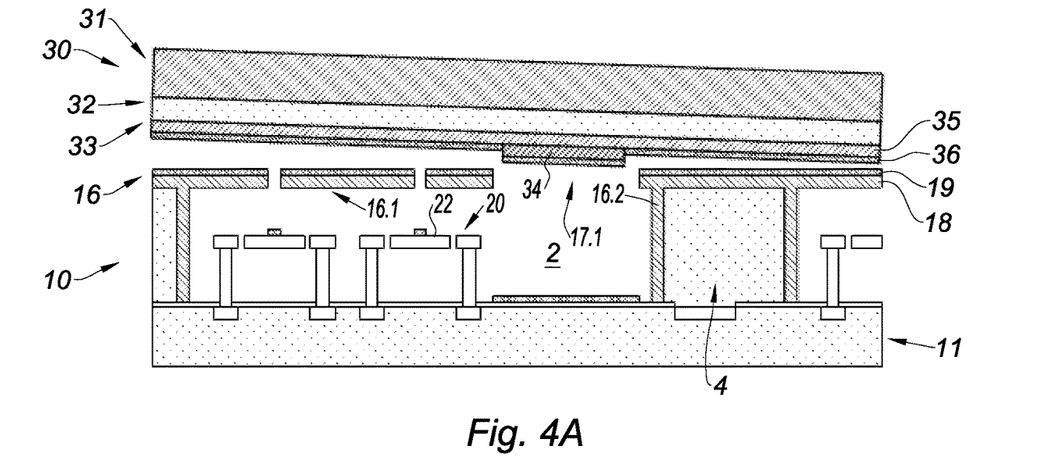
FIGS. 4A to 4C show different steps of a method for fabricating a detection device according to a second embodiment in which the direct bonding is of the ADB (for Atomic Diffusion Bonding) type.
Figure 4B:
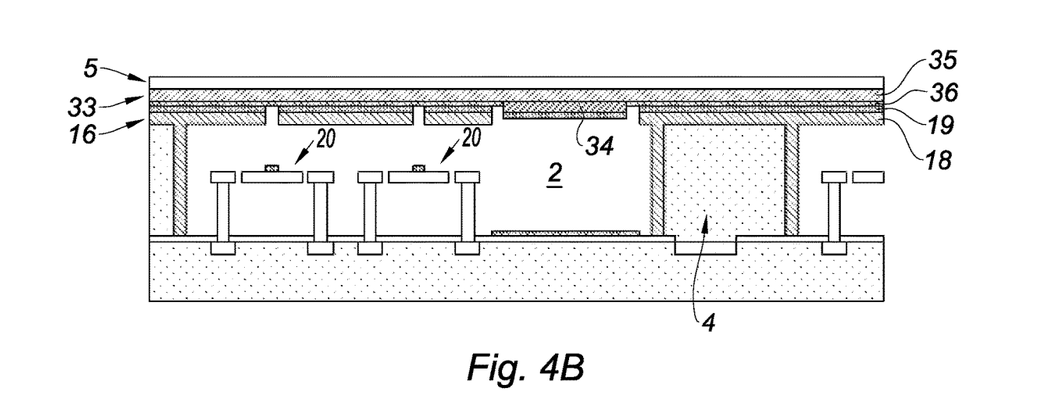
Figure 4C:
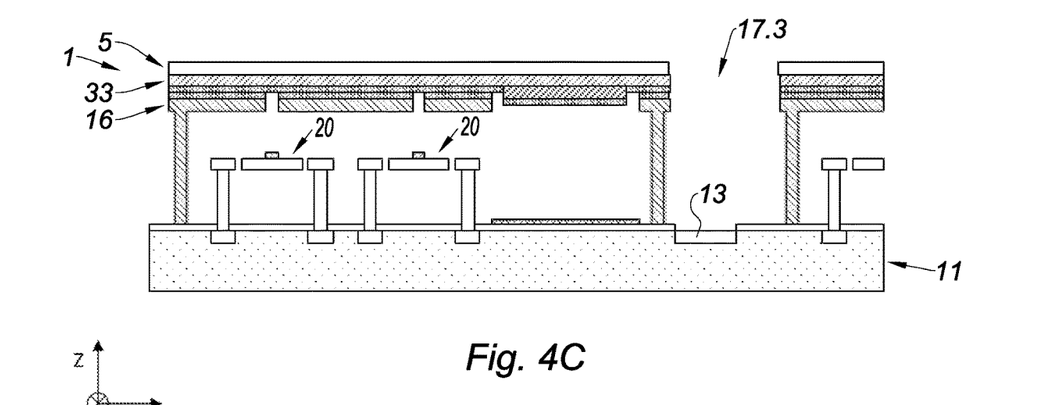

FIGS. 4A to 4C show different steps of a fabrication method according to a second embodiment in which the direct bonding is of the ADB (Atomic Diffusion Bonding) type. This bonding technique is notably suitable for the bonding of two metallic layers at ambient temperature, without any intermediate bonding material such as resin or polymer. It is, notably, described in the paper by Shimatsu and Uomoto, entitled *Atomic diffusion bonding of wafers with thin nanocrystalline metal films*, J. Vac. Sci. Technol. B 28, 706 (2010).

For this purpose, the bonding surfaces of the thin encapsulation layer 16 and of the thin sealing layer 33 are formed by metallic sub-layers 19, 36, preferably made of titanium Ti, having a thickness chosen in order to limit the absorption of the electromagnetic radiation to be detected, for example a thickness less than or equal to 1 nm in the case of titanium. The material of these metallic sub-layers 19, 36 is preferably a material having a getter action, and is preferably identical to that of the getter portion 34.

With reference to FIG. 4A, a first stack 10 is formed, and in this case is similar to that described with reference to FIGS. 2A-2E in the sense that it comprises, in this case, a lateral reinforcing portion 4. However, it is possible for the first stack 10 not to comprise this lateral portion, as described with reference to FIGS. 1A-1F. After the release vents have been formed and the mineral sacrificial layers 15 have been eliminated, a thin metallic layer 19 is deposited, this layer being made in this case, by way of example, of titanium with a thickness of 0.5 nm, deposited by physical deposition in the vapor phase (evaporation, sputtering, etc.) under a vacuum, for example at a pressure less than or equal to $2 \times 10^{-6}$ Pa. The upper wall 16.1 of the thin encapsulation layer 16 is therefore formed of a sub-layer 18, of silicon for example, made in one piece with the peripheral wall 16.2, and a metallic sub-layer 19. In this case, titanium may be deposited on the absorbent membranes 22 as well as on the readout substrate 11. However, the excess thermal mass is negligible and the risks of electrical short circuit are avoided. In this example, it is advantageous for there to be no compensation thermal detector under the lateral vent 17.1.

A second stack 30, similar to that described previously, is formed. However, a second metallic sub-layer 36, preferably identical in thickness and material to the first metallic sub-layer 19, is deposited on a sub-layer 35 of the thin sealing layer 33, and in this case on the getter portion 34. This sub-layer, in this case, is a thin layer 36 of titanium with a thickness of approximately 0.5 nm. More precisely, the thin sealing layer 33 is formed by a sub-layer 35 of silicon (for an SOI substrate) or germanium (for a GeOI substrate), and by a second metallic sub-layer 36.

The second stack 30 is then assembled onto the first stack 10, by bringing the two metallic sub-layers 19, 36 into contact at ambient temperature under a vacuum. Since these metallic sub-layers 19, 36 are formed of a nanocrystalline metal, that is to say a crystalline metal with a thickness of the order of a few nanometers at most, direct bonding between these two metallic surfaces is achieved. The atomic diffusion at the bonding interface enables the cavity 2 to be more strongly sealed.

With reference to FIG. 4B, the supporting substrate 31, 32 is then eliminated, and an antireflection layer 5 is deposited on the free surface of the thin sealing layer 33. This step is identical to those described previously and will not be detailed again.

With reference to FIG. 4C, the lateral reinforcing block 4 is eliminated, so as to allow access to the connection portion(s) 13 and enable the resulting stack to be cut off.

Particular embodiments have just been described. Various modifications and variants will be apparent to a person skilled in the art.

Thus, since the release vents are blocked by the thin sealing layer 33, which is applied and not directly formed on the thin encapsulation layer 16 by evaporative or sputter deposition, the second vents may have larger dimensions than in the prior art. This is because these dimensions are no longer constrained by the need to be easily blockable by the deposited thin layer. This increases the speed at which the material of the mineral sacrificial layers 15 is released from the cavity 2. Moreover, the vacuum level before the activation of the getter may be higher than in the prior art structures, making it possible to reduce the necessary surface area of the getter portion 34.

The surface of the thin sealing layer 33 located facing the thermal detectors 20 may have a supplementary optical function. Thus it may comprise textured portions, each forming an optical filter, an antireflection portion, etc., for example. These textured portions may be formed on the thin sealing layer 33 before the step of assembly by direct bonding, and then positioned in the cavity 2 through a second vent after the assembly step. An example of such textured portions is given in the document EP3399920A1. These textured portions may, in a variant, be formed on the free surface of the thin sealing layer 33 after the step of assembly by direct bonding. It is also possible to structure the lower surface of the thin encapsulation layer 16, notably as described in the document EP3196615A1, to add an optical function (antireflection, etc.) to it, thus improving the performance of the detection device.

The invention claimed is:

1. A method for fabricating a device for detecting electromagnetic radiation comprising the following steps:
    forming a first stack, the first stack including:
        a first substrate,
        at least one thermal detector resting on the first substrate, configured to detect the electromagnetic radiation, and covered with at least one mineral sacrificial layer made of a mineral material that can be eliminated by chemical etching,
        a thin encapsulation layer, extending above the at least one thermal detector and contributing to a delimiting of a cavity in which the at least one thermal detector is located, comprising an upper part resting on the at least one mineral sacrificial layer;
    forming at least one lateral vent, extending through the thin encapsulation layer, and being at a distance from the at least one thermal detector in a plane parallel to the plane of the first substrate;
    eliminating the sacrificial thin layer by chemical etching, this layer being discharged through the at least one lateral vent;
    forming a second stack, the second stack including:
        a supporting substrate,
        a thin sealing layer, transparent to the electromagnetic radiation, and
        at least one getter portion positioned on the thin sealing layer and partially covering the latter;
    assembling the first and second stacks, after the elimination step, by bringing the thin sealing layer into contact with the upper part of the thin encapsulation layer and directly bonding it thereto, so that the at least one getter portion is located in the at least one lateral vent, which is then blocked by the thin sealing layer.

2. The method according to claim 1, wherein the step of assembly by direct bonding is carried out at ambient temperature with a vacuum pressure less than or equal to $10^{-5}$ Pa.

3. The method according to claim 1, further comprising a step of forming a plurality of second release vents, the thin sealing layer additionally blocking the second release vents, wherein the first stack comprises an array of the at least one thermal detector located in the cavity.

4. The method according to claim 1, wherein the thin encapsulation layer is silicon-based, and the thin sealing layer may be silicon- or germanium-based.

5. The method according to claim 1, wherein the thin encapsulation layer includes a contact surface made of silicon, and the thin sealing layer may have a contact surface made of silicon or germanium, and wherein the step of assembly by direct bonding comprises activation of said contact surfaces by partial ion beam etching and vacuum bonding.

6. The method according to claim 1, wherein the upper part of the thin encapsulation layer is formed by a sub-layer made of silicon and a first metallic sub-layer, the thin sealing layer being formed by a silicon- or germanium-based sub-layer and a second metallic sub-layer, the two metallic sub-layers being transparent to the electromagnetic radiation to be detected, and wherein the step of assembly by direct bonding comprises bringing the two metallic sub-layers into contact with one another under a vacuum.

7. The method according to claim 6, wherein said metallic sub-layers each have a thickness less than or equal to 1 nm.

8. The method according to claim 6, wherein said metallic sub-layers are made of a material identical to that of the at least one getter portion.

9. The method according to claim 1, wherein the first stack comprises a plurality of arrays of the at least one thermal detector, each array being located in a distinct cavity delimited at least partially by a respective different thin encapsulation layer, the thin sealing layer coming into contact with the upper parts of the different thin encapsulation layers so as to block the different corresponding lateral vents.

10. The method according to claim 9, wherein the first stack comprises a lateral reinforcing block formed by a lateral cavity delimited in the plane parallel to the substrate by peripheral parts of adjacent thin encapsulation layers, and delimited along the axis orthogonal to the first substrate by an intermediate upper part connecting the upper parts of the adjacent thin encapsulation layers, said lateral cavity being filled by the at least one mineral sacrificial layer, thus reinforcing the mechanical strength of the thin encapsulation layers during the assembly of said stacks by direct bonding.

11. The method according to claim 10, wherein the lateral reinforcing block is eliminated after the step of assembly by direct bonding, by etching the intermediate upper part and eliminating, by chemical etching, the at least one mineral sacrificial layer located in the lateral cavity.

12. The method according to claim 1, wherein the at least one getter portion is located facing a thermal compensation detector, which is configured not to receive the electromagnetic radiation, the at least one getter portion being opaque to the electromagnetic radiation.

13. A device for detecting electromagnetic radiation, comprising:
    a first substrate;
    at least one thermal detector resting on the first substrate and configured to detect the electromagnetic radiation;
    a thin encapsulation layer, extending above and around the at least one thermal detector and contributing to a delimiting of a cavity in which the at least one thermal detector is located, comprising an upper part extending above the at least one thermal detector and a peripheral part extending around the at least one thermal detector in a plane parallel to the substrate;
    at least one lateral vent, extending through the upper part of the thin encapsulation layer, and being at a distance from the at least one thermal detector in a plane parallel to the plane of the first substrate;
    a thin sealing layer, transparent to the electromagnetic radiation, resting in contact with the upper part of the thin encapsulation layer and fixed thereto by direct bonding, and blocking the at least one lateral vent, the thin sealing layer having a flat upper surface opposed to the substrate;
    at least one getter portion assembled onto the thin sealing layer and partially covering the latter, and positioned in the at least one lateral vent.

* * * * *